US010103435B2

(12) United States Patent
Chang et al.

(10) Patent No.: US 10,103,435 B2
(45) Date of Patent: Oct. 16, 2018

(54) SYSTEMS AND METHODS FOR TRANSLOOP IMPEDANCE MATCHING OF AN ANTENNA

(71) Applicant: Dell Products L.P., Round Rock, TX (US)

(72) Inventors: Ching Wei Chang, New Taipei (TW); I-Yu Chen, Taipei (TW)

(73) Assignee: Dell Products L.P., Round Rock, TX (US)

( * ) Notice: Subject to any disclaimer, the term of this patent is extended or adjusted under 35 U.S.C. 154(b) by 51 days.

(21) Appl. No.: 15/346,784

(22) Filed: Nov. 9, 2016

(65) Prior Publication Data

US 2018/0131091 A1 May 10, 2018

(51) Int. Cl.

| | |
|---|---|
| ***H01Q 5/335*** | (2015.01) |
| ***H01Q 1/36*** | (2006.01) |
| ***H01Q 7/00*** | (2006.01) |
| ***H01Q 1/38*** | (2006.01) |
| ***H01Q 1/22*** | (2006.01) |
| *H01Q 13/14* | (2006.01) |
| *H01Q 13/16* | (2006.01) |
| *H01Q 13/12* | (2006.01) |
| *H01Q 13/10* | (2006.01) |
| *H01Q 13/18* | (2006.01) |

(52) U.S. Cl.

CPC ........... *H01Q 5/335* (2015.01); *H01Q 1/2258* (2013.01); *H01Q 1/36* (2013.01); *H01Q 1/38* (2013.01); *H01Q 7/00* (2013.01); *H01Q 13/10* (2013.01); *H01Q 13/103* (2013.01); *H01Q 13/106* (2013.01); *H01Q 13/12* (2013.01); *H01Q 13/14* (2013.01); *H01Q 13/16* (2013.01); *H01Q 13/18* (2013.01); *H05K 999/99* (2013.01)

(58) Field of Classification Search

CPC ........ H01Q 1/2258; H01Q 1/243; H01Q 7/00; H01Q 13/10

See application file for complete search history.

(56) References Cited

U.S. PATENT DOCUMENTS

| | | | | |
|---|---|---|---|---|
| 8,106,836 | B2 * | 1/2012 | Hill | H01Q 1/243 343/700 MS |
| 9,105,966 | B1 * | 8/2015 | Dou | H01Q 1/243 |
| 9,203,141 | B1 * | 12/2015 | Su | H01Q 7/00 |
| 9,325,070 | B1 * | 4/2016 | Obeidat | H01Q 9/0407 |
| 9,431,693 | B2 * | 8/2016 | Kwak | H01Q 1/243 |
| 9,728,858 | B2 * | 8/2017 | Zhu | H01Q 13/10 |
| 9,882,264 | B2 * | 1/2018 | Gummalla | H01Q 1/2258 |

(Continued)

*Primary Examiner* — Dameon E Levi
*Assistant Examiner* — Ab Salam Alkassim, Jr.
(74) *Attorney, Agent, or Firm* — Jackson Walker LLP

(57) ABSTRACT

In accordance with embodiments of the present disclosure, an information handling system may include an enclosure for housing information handling resources of the information handling system, the enclosure having an antenna slot formed therein and formed from a material substantially different from that in which the remainder of the enclosure is formed and a circuit board mechanically coupled to the enclosure and proximate to the antenna slot, the circuit board comprising an antenna electrically coupled at two or more locations to the enclosure so as to form a loop antenna and the antenna positioned such that the antenna at least partially overlaps the antenna slot.

14 Claims, 2 Drawing Sheets

(56) References Cited

U.S. PATENT DOCUMENTS

| | | | | |
|---|---|---|---|---|
| 2003/0193438 | A1* | 10/2003 | Yoon | H01Q 1/243 343/702 |
| 2008/0231521 | A1* | 9/2008 | Anguera Pros | H01Q 1/243 343/702 |
| 2008/0272971 | A1* | 11/2008 | Kanno | H01Q 1/38 343/767 |
| 2012/0268328 | A1* | 10/2012 | Kim | H01Q 1/243 343/702 |
| 2012/0313834 | A1* | 12/2012 | Eom | H01Q 1/243 343/787 |
| 2013/0181871 | A1* | 7/2013 | Eom | H01Q 1/243 343/702 |
| 2013/0201074 | A1* | 8/2013 | Harper | H01Q 1/38 343/870 |
| 2015/0311594 | A1* | 10/2015 | Zhu | H01Q 13/10 343/702 |
| 2016/0142083 | A1* | 5/2016 | Kim | H04B 1/1009 455/300 |
| 2016/0315373 | A1* | 10/2016 | Azad | H01Q 1/243 |
| 2016/0336643 | A1* | 11/2016 | Pascolini | H01Q 9/0442 |
| 2017/0054200 | A1* | 2/2017 | Kang | H01Q 5/35 |
| 2018/0090840 | A1* | 3/2018 | Yu | H01Q 5/371 |

* cited by examiner

SYSTEMS AND METHODS FOR TRANSLOOP IMPEDANCE MATCHING OF AN ANTENNA

TECHNICAL FIELD

The present disclosure relates in general to information handling systems, and more particularly to providing an antenna system for use in an information handling system wherein the antenna comprises a transmission line "trans-loop" impedance-matched antenna.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

An information handling system may comprise a radio-frequency transceiver for wireless communication to and from the information handling system via mobile telephony (e.g., 2G, 3G, 4G, Long-Term Evolution, etc.), Wireless Fidelity (Wi-Fi), Bluetooth, and/or other radio-frequency communication technologies. Effective communication via radio-frequency transmissions typically requires the use of one or more antennas coupled to the radio-frequency transceiver.

Existing approaches to placing and coupling antennas to radio-frequency transceivers in information handling systems have numerous disadvantages. For example, antenna design may be complicated especially in devices which use radio-frequency unfriendly materials (e.g., metal, carbon fiber) for the housing of enclosure of a device, as such materials may block or attenuate radio-frequency signals.

SUMMARY

In accordance with the teachings of the present disclosure, the disadvantages and problems associated with antenna performance in information handling systems may be reduced or eliminated.

In accordance with embodiments of the present disclosure, an information handling system may include an enclosure for housing information handling resources of the information handling system, the enclosure having an antenna slot formed therein and formed from a material substantially different from that in which the remainder of the enclosure is formed and a circuit board mechanically coupled to the enclosure and proximate to the antenna slot, the circuit board comprising an antenna electrically coupled at two or more locations to the enclosure so as to form a loop antenna and the antenna positioned such that the antenna at least partially overlaps the antenna slot.

In accordance with these and other embodiments of the present disclosure, a method may include providing an enclosure for housing information handling resources of the information handling system, the enclosure having an antenna slot formed therein and formed from a material substantially different from that in which the remainder of the enclosure is formed and mechanically coupling a circuit board to the enclosure and proximate to the antenna slot, the circuit board comprising an antenna electrically coupled at two or more locations to the enclosure so as to form a loop antenna and the antenna positioned such that the antenna at least partially overlaps the antenna slot.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
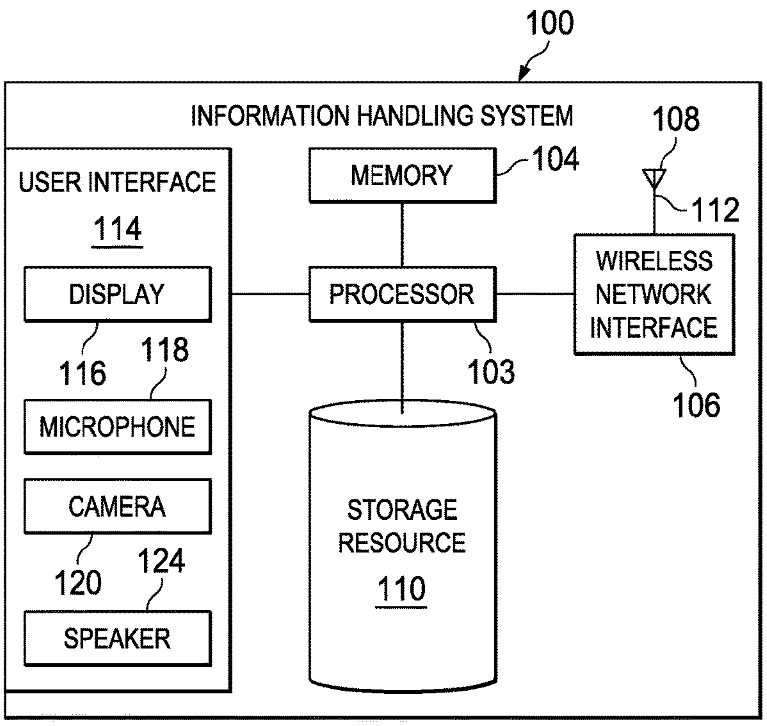
FIG. 1 illustrates a functional block diagram of selected components of an example information handling system, in accordance with embodiments of the present disclosure.
Figure 2:
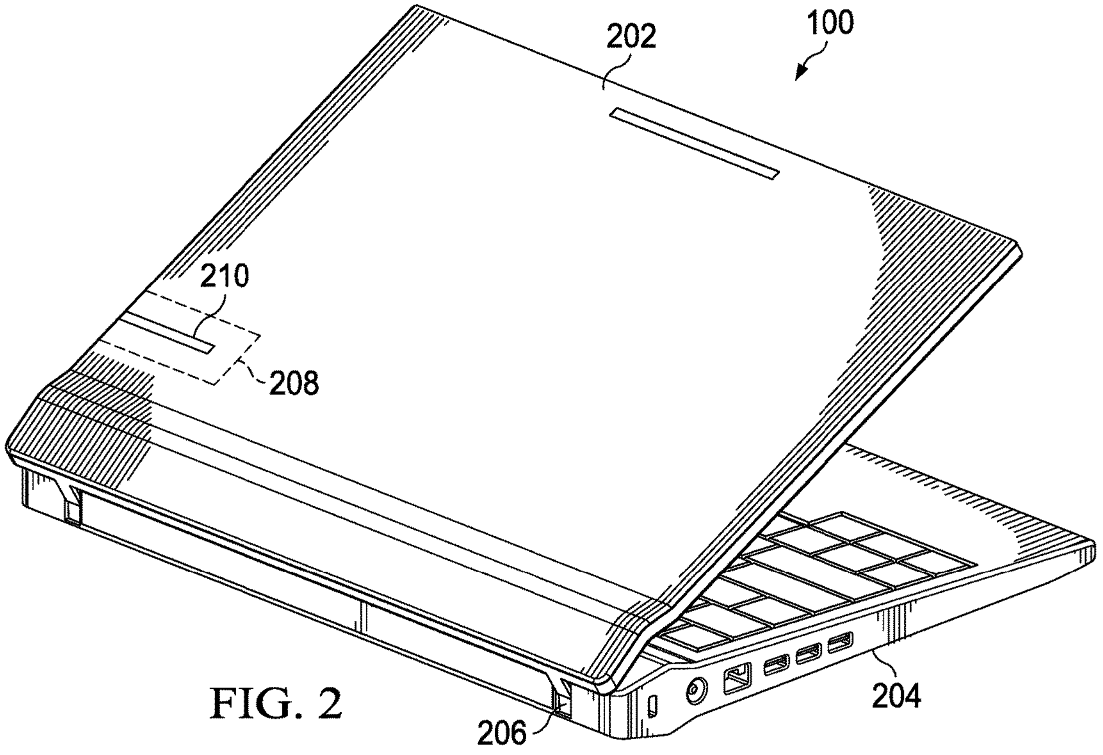
FIG. 2 illustrates an exterior view of selected components of an example information handling system, in accordance with embodiments of the present disclosure.
Figure 3:
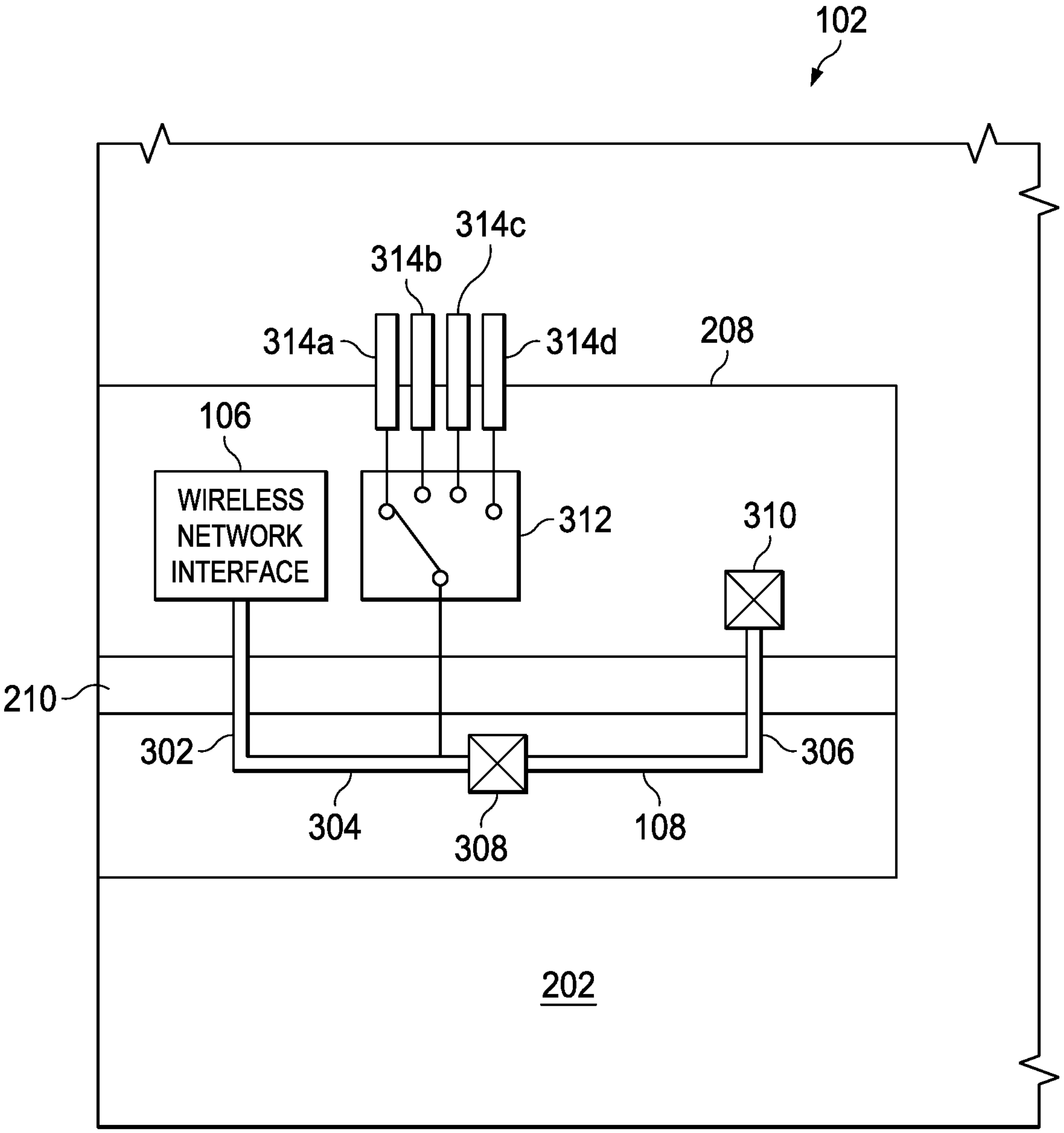
FIG. 3 illustrates an internal view of selected components of an example information handling system, in accordance with embodiments of the present disclosure.

Preferred embodiments and their advantages are best understood by reference to FIGS. 1 through 3, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, the terms "wireless transmissions" and "wireless communication" may be used to refer to all types of electromagnetic communications which do not require a wire, cable, or other types of conduits. Examples of wireless transmissions which may be used include, but are not limited to, short-range wireless communication technologies (e.g., proximity card, Radio-Frequency Identification (RFID), Near Field Communication (NFC), Bluetooth, ISO 14443, ISO 15693, or other suitable standard), personal area networks (PAN) (e.g., Bluetooth), local area networks (LAN), wide area networks (WAN), narrowband personal communications services (PCS), mobile telephony technologies, broadband PCS, circuit-switched cellular, cellular digital packet data (CDPD), and radio frequencies, such as the 800 MHz, 900 MHz, 1.9 GHz and 2.4 GHz bands, infra-red and laser.

FIG. 1 illustrates a functional block diagram of selected components of an example information handling system 100, in accordance with embodiments of the present disclosure. In some embodiments, information handling system 100 may be a personal computer (e.g., a desktop computer or a portable computer). In other embodiments, information handling system 100 may comprise a mobile device (e.g., smart phone, a tablet computing device, a handheld computing device, a personal digital assistant, or any other device that may be readily transported on a person of a user of such mobile device).

As depicted in FIG. 1, information handling system 100 may include a processor 103, a memory 104 communicatively coupled to processor 103, a storage resource 110 communicatively coupled to processor 103, a wireless network interface 106 communicatively coupled to processor 103, a user interface 114 communicatively coupled to processor 103, and an antenna 108 coupled to wireless network interface 106.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104, storage resource 110, and/or another component of information handling system 100.

Memory 104 may be communicatively coupled to processor 103 and may include any system, device, or apparatus configured to retain program instructions and/or data for a period of time (e.g., computer-readable media). Memory 104 may include random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to its associated information handling system 100 is turned off.

Wireless network interface 106 may include any suitable system, apparatus, or device operable to serve as an interface between its associated information handling system 100 and a network, such that information handling system 100 may communicate signals to and from wireless network interface 106 via wireless transmissions (e.g., mobile telephony, Wi-Fi, Bluetooth, mobile broadband telephony). Accordingly, wireless network interface 106 may include a radio-frequency transceiver and/or other components configured to communicate to and from wireless network interface 106 via wireless transmissions.

Antenna 108 may comprise any system, device, or apparatus configured to convert electric power into radio waves, and vice versa. As shown in FIG. 1, antenna 108 may be coupled to wireless network interface 106.

Storage resource 110 may include any system, device, or apparatus configured to store data. Storage resource 110 may include one or more hard disk drives, magnetic tape libraries, optical disk drives, magneto-optical disk drives, solid state storage drives, compact disk drives, compact disk arrays, disk array controllers, and/or any other systems, apparatuses or devices configured to store data. In certain embodiments, storage resource 110 may include one or more storage enclosures configured to hold and/or power one or more of such devices. In the embodiments represented by FIG. 1, storage resource 110 may reside within information handling system 100. However, in other embodiments, storage resource 110 may reside external to information handling system 100 (e.g., may be coupled to information handling system 100 via a network).

User interface 114 may comprise any instrumentality or aggregation of instrumentalities by which a user may interact with information handling system 100. For example, user interface 114 may permit a user to input data and/or instructions into information handling system 100 (e.g., via a keypad, keyboard, touch screen, microphone, camera, and/or other data input device), and/or otherwise manipulate information handling system 100 and its associated components. User interface 114 may also permit information handling system 100 to communicate data to a user (e.g., via a display device, speaker, and/or other data output device). As shown in FIG. 1, user interface 114 may include one or more of a display 116, microphone 118, camera 120, and speaker 124.

Display 116 may comprise any suitable system, device, or apparatus configured to display human-perceptible graphical data and/or alphanumeric data to a user. For example, in some embodiments, display 116 may comprise a liquid crystal display.

Microphone 118 may comprise any system, device, or apparatus configured to convert sound incident at microphone 118 to an electrical signal that may be processed by processor 103. In some embodiments, microphone 118 may include a capacitive microphone (e.g., an electrostatic microphone, a condenser microphone, an electret microphone, a microelectromechanical systems (MEMs) microphone, etc.) wherein such sound is converted to an electrical signal using a diaphragm or membrane having an electrical capacitance that varies as based on sonic vibrations received at the diaphragm or membrane.

Camera 120 may comprise any system, device, or apparatus configured to record images (moving or still) into one or more electrical signals that may be processed by processor 103.

Speaker 124 may comprise any system, device, or apparatus configured to produce sound in response to electrical audio signal input.

In addition to processor 103, memory 104, wireless network interface 106, antenna 108, storage resource 110, and user interface 114, information handling system 100 may include one or more other information handling resources. Such an information handling resource may include any component system, device or apparatus of an information handling system, including without limitation, a processor, bus, memory, I/O device and/or interface, storage resource (e.g., hard disk drives), network interface, electro-mechanical device (e.g., fan), display, power supply, and/or any portion thereof. An information handling resource may comprise any suitable package or form factor, including without limitation an integrated circuit package or a printed circuit board having mounted thereon one or more integrated circuits.

FIG. 2 illustrates an exterior view of example information handling system 100, in accordance with embodiments of the present disclosure. Although FIG. 2 depicts information handling system 100 as a laptop or notebook computer, information handling system 100 may comprise any type of information handling system (e.g., a mobile device sized and shaped to be readily transported and carried on a person of a user of information handling system 100, a desktop computer, a tower computer, a server, etc.), and methods and systems disclosed, described, and claimed herein may not be limited to application to a laptop or notebook computer.

As depicted in FIG. 2, information handling system 100 may include an enclosure comprising a display assembly 202 and a keyboard assembly 204 hingedly coupled via one or more hinges 206. Each of display assembly 202 and keyboard assembly 204 may be integral parts of a chassis or case for information handling system 100. Each of display assembly 202 and keyboard assembly 204 may have an enclosure made from one or more suitable materials, including without limitation plastic, steel, and/or aluminum. Although information handling system 100 is shown in FIG. 2 as having certain components (e.g., display assembly 202, keyboard assembly 204, and hinge 206), information handling system 100 may include any other suitable components which may not have been depicted in FIG. 2 for the purposes of clarity and exposition. In operation, information handling system 100 may be translated between a closed position (e.g., a position of display assembly 202 relative to keyboard assembly 204 such that display assembly 202 substantially overlays keyboard assembly 204, or vice versa) and an open position (e.g., a position of display assembly 202 relative to keyboard assembly 204 such that display assembly 202 does not substantially overlay keyboard assembly 204, or vice versa, such as when the angle formed by display assembly 202 and keyboard assembly 204 at hinge 206 is substantially non zero).

As shown in FIG. 2, display assembly 202 may have an antenna slot 210 formed within a cover thereof and may comprise an antenna circuit board 208 internal to display assembly 202 and proximate to antenna slot 210. In some embodiments, antenna slot 210 may be formed in and antenna circuit board 208 may be internal to keyboard assembly 204. Antenna slot 210 and antenna circuit board 208 are described in greater detail below with respect to FIG. 3.

FIG. 3 illustrates an internal view of selected components of an example information handling system 100, in accordance with embodiments of the present disclosure. In particular, FIG. 3 shows an outer cover (e.g., portion of display assembly 202 opposite a display of display assembly 202) as viewed internally from within display assembly 202. As shown in FIG. 3, antenna circuit board 208 may be mechanically mounted to the cover of display assembly 202 and may partially cover antenna slot 210 as viewed from the inside of display assembly 202.

Antenna circuit board 208 may include any suitable system, device, or apparatus operable to mechanically support and electrically couple electronic components (e.g., packaged integrated circuits) making up an information handling system. As used herein, the term "circuit board" includes printed circuit boards (PCBs), printed wiring boards (PWBs), etched wiring boards, and/or any other board or similar physical structure operable to mechanically support and electrically couple electronic components. Antenna circuit board 208 may include a plurality of pads and traces. Pads may comprise a conductive material and may be formed on a surface of antenna circuit board 208. Further, each pad may be operable to receive a pin of an electronic component (e.g., a packaged integrated circuit or other information handling resource) and provide electrical connectivity between the pin and one or more traces. Traces may comprise a conductive material and may be formed on a surface of antenna circuit board 208, or in a layer of circuit board not visible from the surface thereof. Further, each trace may be operable to provide conductive pathways between electronic components mounted to pads.

Antenna circuit board 208 is not limited to having components on just one side thereof. Traces and pads may be formed on either side of antenna circuit board 208. In addition, antenna circuit board 208 may comprise a plurality of conductive layers separated and supported by layers of insulating material laminated together, and traces may be disposed on and/or in any of such conductive layers. Connectivity between conductive elements disposed on and/or in various layers of antenna circuit board 208 may be provided by conductive vias.

The various pads, traces, and vias may comprise silver, copper, aluminum, lead, nickel, other metals, metal alloys, and/or any other conductive material that may readily conduct electrical current.

As shown in FIG. 3, antenna circuit board 208 may have wireless network interface 106, switch 312, and matching networks 314 (e.g., 314*a*, 314*b*, 314*c*, and 314*d*) mounted thereto, and antenna 108 formed thereon comprising traces 302, 304, and 306 electrically coupled to each other. Antenna 108 may be electrically coupled at one end (e.g., an end of trace 302) to wireless network interface 106 and at its other end (e.g., an end of trace 306) to the cover of display assembly 202 via a via 310 or other conductive element. In addition, antenna 108 may be coupled at an approximate midpoint of antenna 108 (e.g., at the approximate midpoint of trace 304) to the cover of display assembly 202 via a via 308 or other conductive element. In some embodiments, display assembly 202 may be electrically coupled to a voltage rail (e.g., ground voltage rail) of a power supply supplying electrical energy to electronic components of information handling system 100.

Also as shown in FIG. 3, switch 312 may be mounted on antenna circuit board 208 and may be electrically coupled to antenna 108 via a trace or other suitable conductive element. Switch 312 may be configured to switch (e.g., via a manual setting during manufacture of information handling system 100, or via electronic control by a signal communicated from wireless network interface 106 or processor 103) in order to couple to one of a plurality of matching networks 314 in order to provide desired impedance matching for antenna 108.

Antenna slot 210 may be formed in the cover of display assembly 202 and may be formed or filled with a material (e.g., plastic) different than that from which the remainder of the cover is formed (e.g., metal or carbon fiber). As shown in FIG. 3, antenna slot 210 may be of a generally rectangular shape. Antenna slot 210 may be of any suitable dimensions, and in some embodiments, may be sized such that antenna 108 resonates at a desired resonant frequency.

For the purposes of exposition, antenna circuit board 208 and antenna slot 210 are shown as integral parts of display assembly 202. In other embodiments, antenna circuit board 208 and antenna slot 210 could be integral to keyboard assembly 204 or another component of information handling system 100.

As so constructed, antenna 108 may be electrically coupled at two points to a cover of display assembly 202, thus creating a loop antenna, and thus allowing the cover itself to effectively become part of antenna 108 from an electrical standpoint. Due to its proximity to antenna slot 210, such loop antenna may act as a transmission line across antenna slot 210 to excite a resonant frequency. In operation, the length of the loop antenna (e.g., total length of traces 302, 304, and 306) may effectively control different wavelength and hence the resonant frequencies of antenna 108, while placing the loop antenna over antenna slot 108 may allow for second- and third-mode resonating frequencies of antenna 108, thus enabling a “wideband” effect for antenna 108. Accordingly, the loop antenna may effectively be a transmission line which allows an antenna designer to use it as a transmission line to match antenna slot 210 to certain desired frequencies by creating a slot of appropriate size.

Switch 312 may allow for separate impedance matching with one of the plurality of impedance matching networks 314 to allow for even more control over the length of the loop antenna and the impedance matching across antenna slot 210, thus allowing antenna design to be easily integrated and leveraged. Such impedance matching feature may allow for easy implementation across multiple platforms of information handling system 100, without laborious antenna design for each of the platforms, thus allowing a developer of information handling systems to reduce time, work, and expense incident in ensuring a particular platform meets required specifications with minimal design time. In other words, the combination of antenna 108 and antenna slot 210 may allow for decreased reliance on customized antenna designs for each platform by providing a solution which may be leveraged between different platforms by simply maintaining a substantially same mechanical environment across platforms.

As used herein, when two or more elements are referred to as “coupled” to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An information handling system comprising:

an enclosure for housing information handling resources of the information handling system, the enclosure being formed from an electrically conductive material and electrically coupled to a ground of a power supply of the information handling system, the enclosure having an antenna slot formed therein from a material substantially different from the electrically conductive material from which the remainder of the enclosure is formed, the antenna slot having a first side and a second, opposite side; and a circuit board mechanically coupled to the enclosure and proximate to the antenna slot, the circuit board comprising an antenna configured as a loop antenna that includes:

a first end;

a second, opposite end; and a middle portion disposed between the first end and the second end;

wherein the first end of the antenna is electrically coupled to a signal source on the first side of the antenna slot, the middle portion of the antenna is electrically coupled to the enclosure on the second side of the antenna slot, and the second end of the antenna is electrically coupled to the enclosure on the first side of the antenna slot.

2. The information handling system of claim 1, wherein the middle portion of the antenna is electrically coupled to the enclosure at a midpoint of a length of the antenna.

3. The information handling system of claim 1, wherein the loop antenna is located relative to the antenna slot such that the loop antenna is configured to act as a transmission line across the antenna slot to excite a resonant frequency.

4. The information handling system of claim 3, wherein resonating frequencies of the loop antenna are based on a length of the loop antenna.

5. The information handling system of claim 4, wherein at least one additional resonating frequency of the antenna is based on a size of the antenna slot.

6. The information handling system of claim 1, wherein the antenna is electrically coupled to a switch configured to switch among a plurality of switching networks for impedance matching the antenna to operate at a desired resonant frequency.

7. The information handling system of claim 1, wherein the antenna slot is generally rectangular-shaped.

8. A method comprising:

providing an enclosure for housing information handling resources of an information handling system, the enclosure being formed from an electrically conductive material and electrically coupled to a ground of a power supply of the information handling system, the enclosure having an antenna slot formed therein from a material substantially different from the electrically conductive material from which the remainder of the enclosure is formed, the antenna slot having a first side and a second, opposite side; and mechanically coupling a circuit board to the enclosure and proximate to the antenna slot, the circuit board comprising an antenna configured as a loop antenna that includes:

a first end;

a second, opposite end; and a middle portion disposed between the first end and the second end;

wherein the first end of the antenna is electrically coupled to a signal source on the first side of the antenna slot, the middle portion of the antenna is electrically coupled to the enclosure on the second side of the antenna slot, and the second end of the antenna is electrically coupled to the enclosure on the first side of the antenna slot.

9. The method of claim 8, further comprising electrically coupling the middle portion of the antenna to the enclosure at a midpoint of a length of the antenna.

10. The method of claim 8, further comprising locating the loop antenna relative to the antenna slot such that the loop antenna acts as a transmission line across the antenna slot to excite a resonant frequency.

11. The method of claim 10, further comprising sizing a length of the loop antenna to set resonating frequencies of the loop antenna.

12. The method of claim 11, further comprising sizing a size of the antenna slot to set at least one additional resonating frequency of the antenna.

13. The method of claim 9, further comprising electrically coupling the antenna to a switch configured to switch among a plurality of switching networks for impedance matching the antenna to operate at a desired resonant frequency.

14. The method of claim 8, wherein the antenna slot is generally rectangular-shaped.

* * * * *